United States Patent [19]
Lee

[11] Patent Number: 5,526,322
[45] Date of Patent: Jun. 11, 1996

US005526322A

[54] LOW-POWER MEMORY DEVICE WITH ACCELERATED SENSE AMPLIFIERS

[75] Inventor: Napoleon W. Lee, Milpitas, Calif.

[73] Assignee: Xilinx, Inc., San Jose, Calif.

[21] Appl. No.: 311,094

[22] Filed: Sep. 23, 1994

[51] Int. Cl.⁶ .............................. G11C 13/00; G11C 7/00
[52] U.S. Cl. .................... 365/233.5; 365/205; 365/227
[58] Field of Search .................... 365/233.5, 205, 365/189.01, 227

[56] References Cited

U.S. PATENT DOCUMENTS

| | | | |
|---|---|---|---|
| 4,922,461 | 5/1990 | Hayakawa et al. | 365/230.08 |
| 4,967,107 | 10/1990 | Kaplinsky | 307/465 |
| 5,025,422 | 6/1991 | Moriwaki et al. | 365/233.5 |
| 5,126,970 | 6/1992 | Ul Haq | 365/154 |
| 5,162,680 | 11/1992 | Norman et al. | 307/530 |
| 5,193,076 | 3/1993 | Houston | 365/233.5 |
| 5,214,610 | 5/1993 | Houston | 365/233.5 |
| 5,258,952 | 11/1993 | Coker et al. | 365/233 |
| 5,343,428 | 8/1994 | Pilo et al. | 365/189.05 |
| 5,345,425 | 9/1994 | Shikatani | 365/230.01 |

*Primary Examiner*—Viet Q. Nguyen
*Attorney, Agent, or Firm*—Edel M. Young; Clifton L. Anderson

[57] ABSTRACT

An AND array for an erasable programmable logic device (EPLD) includes word-line transition detectors for indicating high-to-low word-line transitions. Such transitions are a condition precedent for low to-high bit line transitions. Transition indications are buffered by a fast transition-detection sense amplifier, the output of which is provided to each of plural "mode-switchable" sense amplifiers that read out the bit lines for the AND array. Each mode-switchable sense amplifier logically combines the transition indication with its own output to select its operating mode. A fast (strong source-current) mode is entered only when,the transition indication is active and the present output of the sense amplifier is low. Otherwise, which is most of the time, the mode switchable sense amplifier remains in a low-power (weak source-current) mode. This arrangement provides higher speed operation with relatively low time-averaged power consumption.

6 Claims, 3 Drawing Sheets

LOW-POWER MEMORY DEVICE WITH ACCELERATED SENSE AMPLIFIERS

BACKGROUND OF THE INVENTION

The present invention relates to integrated circuits and, more particularly, to integrated circuit memory devices. A major objective of the present invention is to provide for erasable programmable logic devices (EPLDs) that achieve high operating speeds with relatively low power requirements.

Much of modern progress is associated with the increasing functionality and speed of integrated circuits. When produced in large quantities, integrated circuits are sufficiently inexpensive that computers, instruments, and consumer products incorporating them are within the reach of everyone. However, very high start-up costs, including research, manufacturing facilities, design, processing, and testing, can be prohibitive for small volume applications. Low volume runs are important, not only for certain specialized applications, but as intermediate steps in the development of integrated circuits eventually destined for large volume production.

Various "application-specific integrated circuit" (ASIC) technologies have addressed the problem of start-up costs. However, because they involve reliance on further manufacturing to realize a design, start-up costs are higher than desired for many applications.

Where the desired functionality can be achieved, programmable devices afford a very attractive approach to small volume integrated circuit manufacturing. The functionality of programmable devices is determined after they are manufactured, typically by selecting binary values to be stored in included memory cells. The most basic programmable device is a programmable read-only memory (PROM). Programming a PROM determines what data will be output for each of its memory addresses.

Programmable device designs can be updated or improved and then implemented by a device replacement. Erasable programmable devices permit updates by erasing the old and programming the new without changing the integrated circuit. While many erasable devices rely on exposure to ultra-violet radiation for erasure, others, notably electrically-erasable programmable read-only memories (EEPROMS) and their logic counterparts can be erased in circuit. The advantages of erasable devices, especially those that are electrically erasable, during iterative design stages is clear. Their susceptibility to improvements has made such devices attractive even in high volume applications.

More sophisticated functionality can be achieved using programmable logic arrays (PLAs), which allow post-manufacturing selection of logic functions by storing binary values in included memory cells. The erasable counterpart to the PLA is the erasable programmable logic device EPLD, which offers both sophisticated functionality and the convenience of reprogrammability.

Logical functions can be expressed as a combination of inversions, AND functions (logical products), and OR functions (logical sums). A typical functional block of an EPLD includes a bank of OR gates, each of which is fed by several AND gates, each of which is fed by both inverted and uninverted inputs. The output of such a logical block is the logical sum of logical products of inverted and uninverted inputs. Any logical product including both a binary value and its inverse is zero, so provision is made for deactivating one of each complementary pair of the inputs to permit nonzero outputs.

More specifically, each AND gate in such an EPLD function block has an associated bit line. EPROM elements are connected in parallel between each bit line and a "virtual ground" line, which is maintained at a relatively low voltage. When any of its EPROM elements are conductive, a bit line assumes a logic low voltage. Otherwise, it assumes a logic high voltage. When an EPROM element is unprogrammed, a logic high voltage applied to its gate (control) input renders it conductive; while a logic low gate input voltage renders it nonconductive. When the EPROM element is programmed, it is nonconductive irrespective of the gate voltage. Thus, the control inputs of only the unprogrammed (erased) EPROM elements function as AND gate inputs.

Typically, the EPROM elements are arranged in a two-dimensional array. The control inputs of EPROMs in a row are connected to a common word line. EPROMs in a column are connected to a common bit line. The word lines are arranged in inverted/uninverted pairs to provide inverted inputs as necessitated by the overall logic function to be implemented. EPROM elements that are not required are programmed to be nonconductive. The EPROMs do not consume power when nonconducting; in the context of an AND array, programmed EPROMs remain in a "high" state, which is the innocuous state for an AND gate input. A typical application would require most of the EPROM elements to be programmed, which can be a relatively time-consuming process.

Each bit line of the AND array is coupled to the input of a sense amplifier, which serves to amplify and buffer the voltage representing the AND gate output on its way to an input of an OR gate to contribute to the final sum of products logical output. The sense amplifier can have the same or the opposite sense as the bit line. Given a sense amplifier output with the same sense as the connected bit line, when all of the associated EPROM elements are nonconductive, the bit line and the sense amplifier output are high. When any of the associated EPROM elements are conductive, the bit line and the sense amplifier output transition to a low output. When next all associated EPROMs are nonconductive, the bit line and the sense amplifier output transition to a high output.

The transition from low to high is not instantaneous. Capacitances, including those associated with each of the connected EPROM elements, must be filled before the logic high voltage is reached. The rate at which the capacitances are filled depends on the magnitude of the source current. A larger source current provides for a faster low-to-high bit-line transition. The faster this transition is completed, more promptly the AND array can respond reliably to a new input. The faster new inputs can be handled, the higher the performance of the overall EPLD device. Since the market's appetite for higher performance appears insatiable, faster is better all else being equal.

Unfortunately, not all else is equal since a larger source current involves greater power consumption. Greater power consumption can mean greater electrical costs; for battery powered devices, it can mean shorter battery lifetimes greater power consumption also results in greater heat dissipation, which is a major factor in device failures. If the greater heat dissipation is compensated for by peripheral cooling systems, this adds cost and complexity to the system.

Accordingly, EPLD designers (as well as designers of other memory and logic devices) are confronted with a conflict between the objectives of greater speed and lower power consumption. What is needed is an approach to achieving higher performance with less of a penalty in power consumption.

SUMMARY OF THE INVENTION

In accordance with the present invention, "mode-switchable" sense amplifiers provide for alternative "fast" and "low-power" modes of operation. The fast mode is used to increase the speed of low-to-high transitions. (Throughout this summary, transition directions and logic levels apply to conventional EPLD arrays. However, it is within the scope of the invention to invert these directions and logic levels in a logically consistent manner as set forth in the claims.) The low-power mode is used to reduce overall power consumption when low-to-high bit-line transitions cannot occur. Low-power mode can also facilitate high-to-low bit-line transitions. The mode switch can be implemented by increasing the source current for the sense amplifier in anticipation of possible low-to-high bit-line transitions.

Understanding of the present invention may be facilitated by an analogy with turbo charging. Turbo-charging is a technique employed by the auto industry to enhance the performance of more fuel-efficient combustion engines. When the driver presses on the accelerator, a turbine is activated to facilitate a low-to-high speed transition. At other times, the turbine is idle. Analogously, the mode-switchable sense amplifiers of the present invention activate a supplementary source current to facilitate a low-to-high bit-line transition. As a result, the performance of a power-efficient memory array is enhanced. In the analogy, the roles of the accelerator and the turbine are respectively assumed by a global word-line transition detector and supplementary source currents.

The inventive memory device includes an array of memory elements, e.g., EPROMs. Each EPROM is capable of storing either: a low logic level, e.g., a "zero" corresponding to an erased EPROM state; or a high logic level, e.g., a "one" corresponding to a programmed EPROM state. Each EPROM includes a control input, e.g., a gate, and two terminals, e.g., a source and a drain. An EPROM storing a logic low and having a logic high applied to its control input is conductive between its terminals. Otherwise, it is non-conductive. For example, an erased EPROM is conductive when a logic high is applied to its control input and nonconductive when a logic low is applied to its control input; a programmed EPROM is nonconductive irrespective of the value at its control input.

The EPROMs can be arranged in rows and columns. The control inputs of EPROMs in a row can have their control inputs coupled to a common word line. One terminal of each EPROM in a column is connected respectively to a common bit-line, while the other is coupled to ground or virtual ground. A bit line is high when and only when all connected EPROMs are nonconductive. When any connected EPROM is conductive, the bit line is low. It follows that a bit-line can only be low when a word-line is high and that a low-to-high bit-line transition can occur only in response to a high-to-low word-line transition.

The present invention anticipates these high-to-low word-line transitions so that sense-amplifier mode switching can occur in time to assist the concomitant low-to-high bit-line transitions. To this end a global word-line transition detector includes word-line transition detectors for each word line. The individual word-line transition detectors react to transitions on a pre-word line, which carries the wordline signal before it is buffered. Since the buffering, typically implemented using an inverter, involves a delay, individual word-line detectors can anticipate word-line transitions.

An individual word-line detector can include a pair of transistors arranged in series between a logic high voltage (VDD) and the bit line to serve as an AND gate. One of the transistors is directly controlled by the pre-word line, while the other is tied to a delayed inversion of the pre-word line. The delay is selected to be comparable to the time required for a low-to-high bit-line transition. A logic high output of the AND gate anticipates a high-to-low word-line transition on the corresponding word line. The AND output goes low again once the delayed inversion of the transition reaches the AND gate.

The global transition detector includes a "transition-detection" bit line to which all individual word-line transition detectors are coupled. The transition detection bit line assumes a value which is the logical sum (OR) of the individual transition-detection outputs. (Other Boolean functions can be implemented using functionally equivalent transition detection logic.) A fast sense amplifier then amplifies the bit line value and provides it to the mode-switchable sense amplifiers.

To ensure that the resulting global transition-detection output reaches the mode-switchable sense amplifiers no later than a change on the respective bit line, the fast sense amplifier is optimized for fast transition indications. For example, the fast sense amplifier can have a large constant source current for promoting fast low-to-high transitions in the transition-detection bit line.

Since bit-lines must start from a logic low to undergo a low-to-high bit-line transition, each mode-switchable sense amplifier logically combines its current output with the output of the global transition detector to determine its operating mode. A switch to fast mode occurs only when, while the respective bit-line is low, a high-to-low word-line transition is indicated. While the fast sense amplifiers consume considerable power per sense amplifier, there are relatively few per array; the additional power they consume is more than offset by the reduced power consumed by the more numerous mode-switchable sense amplifiers in low-power mode.

The system, as heretofore described, provides for transitions to fast mode for a mode-switchable sense amplifier whenever a low-to-high bit-line transition can occur on the respective bit-line. However, it may permit a switch to fast mode even when no such bit-line transition occurs. If a bit line is low while exactly one word line is high, it is certain that the bit line will go high when that word line transitions to a low provided no other word line is activated in the meantime. However, if another word line transitions to a high as the first word line transitions to a low, it is not in general predictable whether or not the bit line will transition to a high. Also, if multiple word lines are high, as can occur in an AND array, the fact that one word line transitions to a low does not determine whether or not a bit-line transition to high will occur. Thus, some false positives are practically inevitable. In such "false-positive" cases, the power consumed is wasted.

The present invention can reduce false positives where, by design, some word lines are to have no effect on the AND array output. In the prior art, this situation is handled by programming all memory elements (with some exceptions) in the corresponding row so that they do not conduct when the word line is activated. In the context of the present invention, this would not prevent a word-line transition from being activated, resulting in a false-positive source-current increase.

The present invention provides two alternatives for preventing these false positives. The first approach is to allow word line transitions but to inhibit the transition from being indicated. For example, where EPROMs are used as part of the word-line transition detectors, an EPROM can be programmed so that it does not indicate a transition even while its control input is high.

The second approach to preventing false positives is to preclude transitions in word lines that are not to affect the array output. Precursor lines to word lines typically include a pass gate. A configuration bit (e.g., a latch set during system initialization) can be set so that this pass gate is off. This maintains the word line at a low logic level so that no transitions occur. A beneficial side-effect of this approach is that it is no longer necessary to program the individual memory elements driven by the deactivated word line. This saves programming time.

Just as there are often unused word lines, some designs stipulate that some bit lines are not to affect the array output. The present invention provides for dedicating a word line and a row of "deactivating" memory elements to implement such a stipulation. A bit line can be deactivated by holding it at a logic low level. Accordingly, the respective bit on the dedicated word line can be left unprogrammed and the dedicated word line held high. The deactivating memory elements for active bit lines can be programmed so that they do not conduct.

Where this dedicated word line is implemented, it is known that a deactivated bit line will not transition to a logic high. Accordingly, the programmed state of the associated bit along with dedicated word line can be used to preclude increases in the source current for that bit line. During initialization, the program status of each of the bit-line configuring memory elements can be read into a configuration bit. This configuration bit can then be used to determine whether or not source current is increased in response to a word line transition. If a bit line is deactivated, the fast mode of the connected sense amplifier is disabled.

The present invention applies to EPLD AND arrays and similar devices having an array of memory elements connected between bit lines and a ground or virtual ground. For example, EPLD devices typically include multiplexers that interconnect multiple functional blocks. These multiplexers also take the form of memory arrays; the present invention can be applied to make these multiplexers fast and power efficient. In addition, the present invention applies to EPROM memory arrays.

Most volatile random access memory arrays connect memory elements between a pair of bit lines, each with its own current source. The present invention can be applied to memory arrays with dual-bit lines. In these cases, it is preferable to use the present sense amplifier output to determine which of the two source currents should be increased in response to a suitable word-line transition. In effect, the invention is applied twice, once for each of the two current sources.

The present invention provides an increased source current whenever a low-to-high bit-line transition could occur. The present invention provides for a diminished source current when a low-to-high bit line transition cannot occur. This keeps the time-averaged power consumption at a relatively low level. In addition, high-to-low bit-line transitions can occur relatively fast since they do not have to overcome a high source current. Furthermore, the Word-line deactivation provided by the present invention reduces programming time. These and other features and advantages of the present invention are apparent from the description below with reference to the following drawings.

DESCRIPTION OF THE PREFERRED EMBODIMENTS

Figure 1:
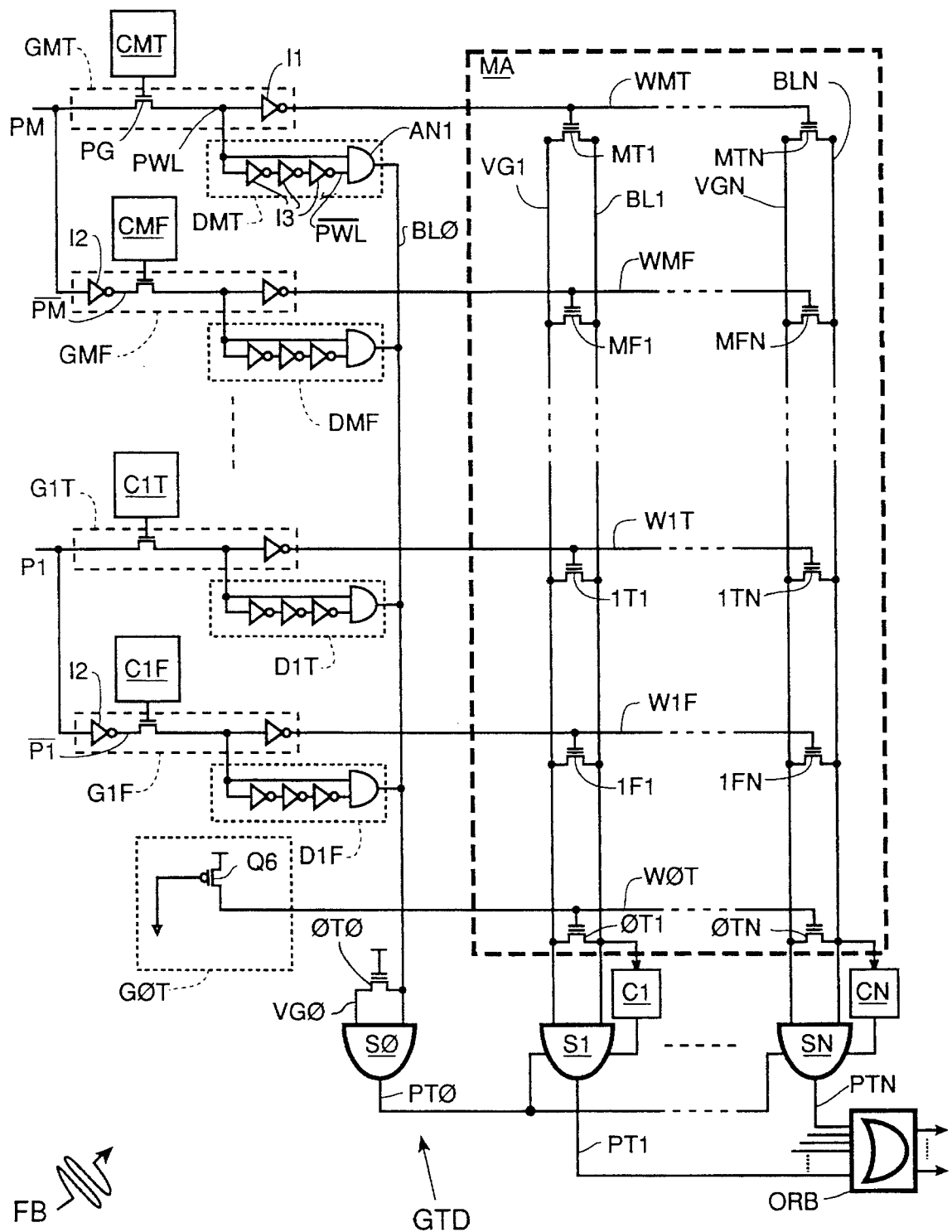
FIG. 1 is a schematic view of a EPLD functional block in accordance with the present invention.

In accordance with the present invention, as shown in FIG. 1, an EPLD functional block FB comprises an array MA of EPROMs ØT1-MTN, a series of word-line generators GØT-GMT, a corresponding series of word lines WØT-WMT, a series of bit lines BL1-BLN, a corresponding series of virtual ground lines VG1-VGN, a corresponding series of mode-switchable sense amplifiers S1-SN, a bank ORB of OR gates, and a global transition detector GTD. M and N are positive integers; in the illustrated example, M=24 and N=45. In the array, the number of rows is 2M+1 and the number of columns is N, thus array MA is 49×45.

The expression 2M+1 for the number of rows reflects an odd word line (WØT) dedicated to holding selected bit lines low and the pair-wise (true/false) arrangement of the remaining word lines W1F,W1T . . . WMF,WMT. In the indexing scheme, memory element ijk is connected to word line Wij and bit line BLk, where $i \geq 0; j=F,T; k \geq 1$: and ij≠0,F. Indices are not used for subcomponents of indexed components.

The word-line generators, e.g., word-line generator GMT, each include a pass gate PG, a pre-word-line node PWL, and an inverter I1. Inverters I1 serve primarily as word-line drivers. "False" word-line generators, e.g., word-line generators G IF and GMF, each include an inverter I2 for which "true" word-line generators, e.g., word-line generators G iT and GMT, lack a counterpart. Assuming all paired word-line generators G IF-GMT are active, the logic levels of complementary word lines are complementary. For example, word line W1T is generally high when word line W1F is low, provided they are both active.

Each EPROM of array MA is in either a "programmed" state or an "erased" state. An EPROM in the programmed state is nonconductive. An EPROM in the erased state is conductive when its gate (i.e., its control input) is high, and nonconductive when its gate is low. All EPROMs in a given row have their gates controlled by a common word line. When a word line assumes a high word-line voltage, all erased EPROMs controlled by that word line are rendered conductive.

All EPROMs in a column are connected between a common bit line and to the corresponding virtual-ground line, the voltage of which varies within a relatively low voltage range. If any of the EPROMs connected to a bit line is rendered conductive, the bit line is shorted to virtual ground and assumes a low bit-line voltage. Otherwise, the bit line assumes a high bit-line voltage.

The bit-line voltage represents the logic product (AND function) of the programmed statuses of the connected EPROMs that have gates held at a high word-line voltage. For a first example, if all EPROMs ij1 connected to bit line BL1 are programmed, then bit line BL1 is high irrespective of word line values. For a second example, if EPROM 1T1 is the only erased EPROM connected to bit line BL1, the latter is only low while word line WIT is high. For a third example, if word lines WIF and WIT are both active and if EPROMs 1F1 and 1T1 are both erased, bit line BL1 is always low. (The prior art makes use of this to set unused bit lines to a permanently low output.)

Sense amplifiers S1-SN serve primarily to amplify and buffer the respective bit lines. Their outputs PT1-PTN are input to OR bank ORB, which includes OR gates (as well as exclusive-OR gates and reset circuits). OR bank ORB logically sums the outputs from groups of sense amplifiers S1-SN, generating the desired logical sums of products.

A crucial feature of sense amplifiers S1-SN is that they can be switched from a low-power mode to a fast mode in response to the output PTØ from global transition detector GTD. Global transition detector GTD comprises word-line transition detectors DIF, DIT, ... DMF, DMT, a transition-detection bit line BLØ, an EPROM ØTØ, and a fast sense amplifier SØ, as indicated in FIG. 1.

The word-line transition detectors each include a two-input AND gate AN1, with one input connected to node PWL and the other input connected to the output of a series of three inverters 13, the input of which is coupled to node PWL. Inverter series 13 functions as a delay and a single inverter. Accordingly, the inputs to gate AN1 are PWL and its delayed complement $\overline{PWL}$.

During steady-state conditions, one of PWL and $\overline{PWL}$ must be low, so the output of gate AN1 is low in the absence of a transition. During a low-to-high word-line transition, PWL goes from high-to-low, while $\overline{PWL}$ remains low during the delay period; accordingly, the output of gate AN1 is low. During a high-to-low word-line transition, PWL transitions from low-to-high, while $\overline{PWL}$ remains high, resulting in a high output from gate AN 1 during the delay duration. Thus, a high output from gate AN1 indicates the high-to-low word-line transition that is a condition precedent to low-to-high bit-line transitions.

Bit line BLØ acts as an OR gate so that if any word line is undergoing a high-to-low transition, bit line BLØ goes high. If no word line is undergoing a high-to-low transition, bit line BLØ remains low. The bit-line voltage is amplified and buffered by fast sense amplifier SØ. Bit line BLØ is connected to the positive input of sense amplifier SØ. The negative input is coupled to a virtual ground VGØ. Bit line BLØ and virtual ground VGØ are coupled through an erased (conductive) EPROM ØTØ.

The output PTØ is used to enable the fast mode of sense amplifiers S1-SN to assist a bit-line low-to-high transition. These transitions occur only in response to high-to-low word-line transitions, which is why the word-line transition detectors are designed to respond to such transitions. The challenge is for this enable signal to reach and affect these sense amplifiers in time to benefit their transitions.

The present invention addresses this challenge in the first instance by monitoring PWL, rather than the corresponding word line. Transitions in PWL anticipate transitions in the corresponding word line by the delay imposed by inverter I1; this delay is about 1 nanosecond (ns). Note that inverters 13 do not delay transition detection, they only determine the duration, about 3 ns, of the transition indication.

Figure 2:
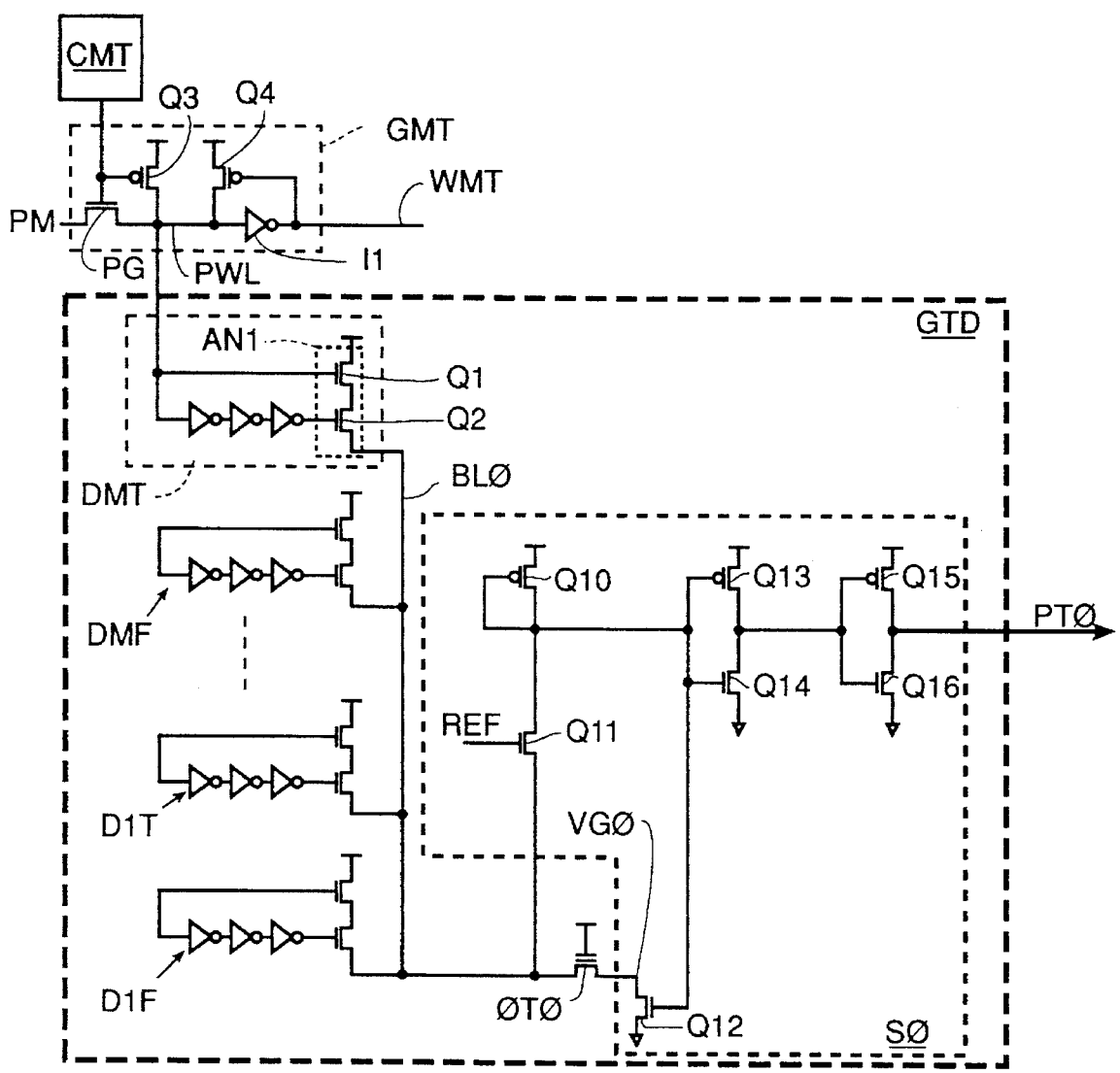
FIG. 2 is a circuit diagram of a fast sense amplifier incorporated in the functional block of FIG. 1.

The challenge is further addressed by the implementation of the AND gates of the word-line transition detectors. The first delay encountered by the transition detection is at gates AN1. As shown in FIG. 2, gates AN1 are implemented using series pairs of fast NMOS transistors Q1 and Q2. For the transition of interest, Q2 is already on. Thus, the only delay is the turn on time for Q1. This delay is about 0.3 ns. Thus, by the time a word line has undergone its high-to-low transition, the transition indication is developed on bit line BLØ.

Finally, the challenge is addressed by optimizing sense amplifier SØ for speed. Sense amplifier SØ comprises a current source transistor Q10, voltage-divider transistor Q11 controlled by a reference voltage REF, a drain transistor Q12, a first PMOS/NMOS pair of transistors Q13 and Q14 functioning as a first inverter, and a second PMOS/NMOS pair of transistors Q15 and Q16, serving as a second inverter and the output of sense amplifier SØ.

Those skilled in the art can recognize from FIG. 2 that sense amplifier SØ is of conventional design, so it is not described in detail herein. It is optimized for speed by selecting a high current source transistor Q10. A relatively large source current is achieved due to its relatively high aspect ratio of 3.75; Q10 has a width of 6 microns (µm) and a length of 1.6 µm. The low-to-high transition time for fast sense amplifier S is about 1 ns. In general, the dimensions of the source transistor of the fast sense amplifier are selected so that the total delay of the transition indication from PWL to PTO is about equal to the delay imposed by word-line inverters I1.

Figure 3:
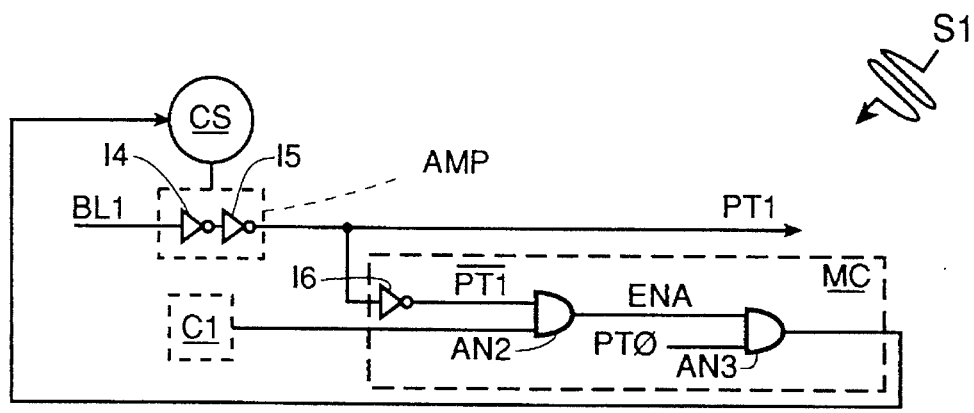
FIG. 3 is a logic diagram of a mode-switchable sense amplifier incorporated in the functional block of FIG. 1.

As indicated in FIG. 3 for exemplary mode-switchable sense amplifier S1, a current source CS drives amplifier section AMP, represented in FIG. 3 as a series pair of inverters 14 and 15. Current source CS is controlled by a mode controller MC so that the current supplied to amplifier section AMP is increased in response to a high-to-low word-line transition.

The mode controller output is the output of an AND gate AN3 that has PTØ and an enable signal ENA at its inputs. When enable signal ENA is high, PTØ can initiate a supplementary source current. Enable signal ENA is the output of an AND gate AN2, which has one input connected to a configuration bit C1. A logic low C1 indicates that the bit line is to be held low so that no transitions can occur. Accordingly, fast mode is disabled.

The other input of gate AN2 is coupled to an inverter 16 that has PT1 as its input. Accordingly, delayed inversion $\overline{PT1}$ must be high for fast mode to be enabled. This corresponds to PT1 being low, which of course is a necessary precondition for a low-to-high bit-line BL1 transition.

Figure 4:
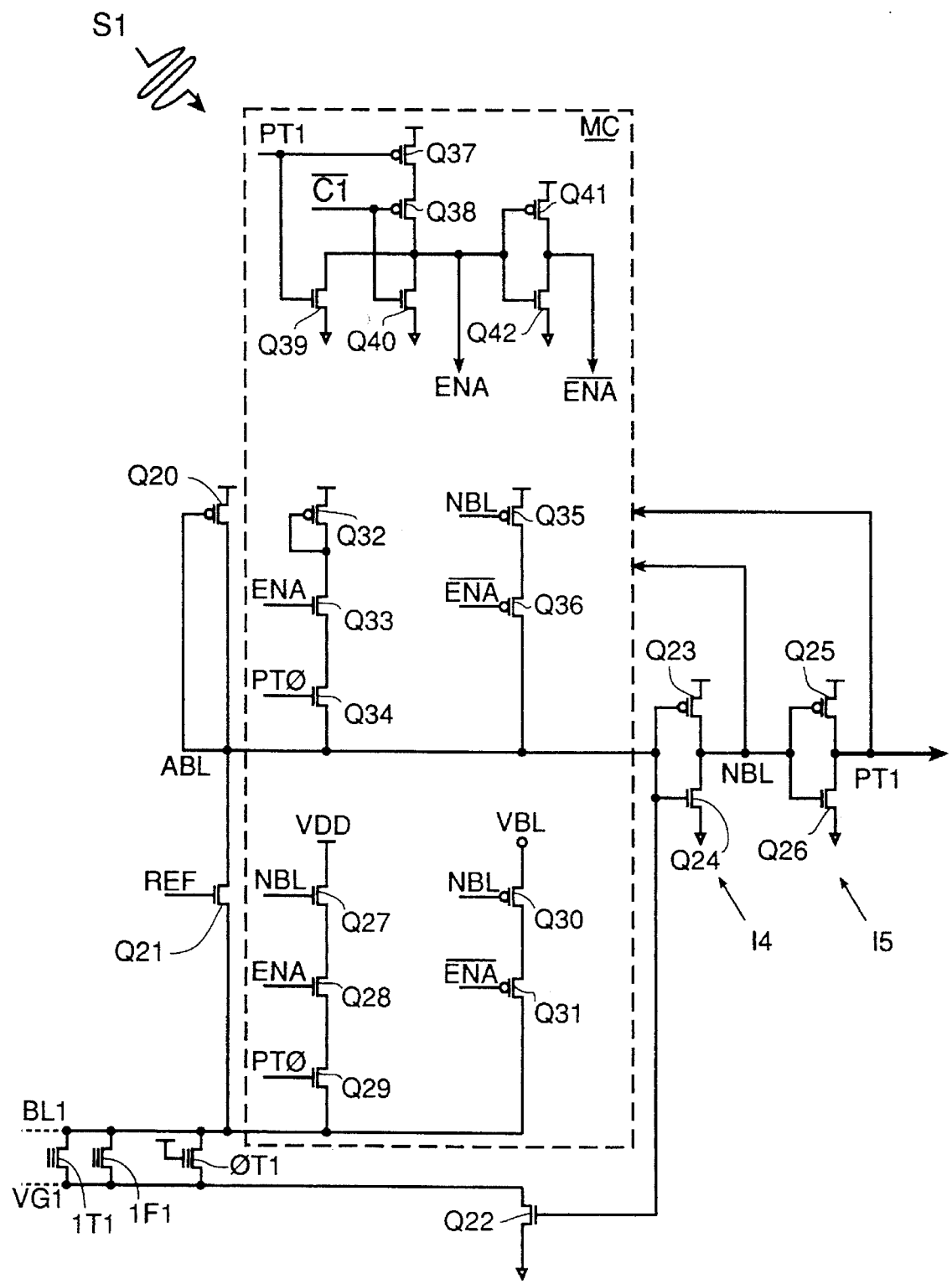
FIG. 4 is a circuit diagram of the mode-switchable sense amplifier of FIG. 3.

A transistor-level representation of exemplary sense amplifier S1 is shown in FIG. 4. Comparison with sense amplifier SØ shows that S1 is basically of conventional design in that transistors Q20-Q26 have their counterparts Q10-Q16, respectively, in FIG. 2. The logic level of bit line BL1 is amplified at node ABL. NBL is the delayed and inverted amplification of ABL. PT1 is the delayed and inverted amplification of NBL, and thus the delayed amplification of ABL and BL1.

The major difference between mode-switchable sense amplifier S1 and fast sense amplifier SO is that source transistor Q20 is a much weaker current source than transistor Q10 of sense amplifier SØ. Its width is 2.4 µm and its length is 10 µm, for an aspect ratio of 0.24. The aspect ratio of Q10 is about 15–16 times greater. This accounts for the greater power savings available from sense amplifier S1 in its low-power mode.

Mode control is provided by mode control section MC of sense amplifier S1, which includes transistors Q27-Q42. Transistors Q27-Q36 are arranged as four series of transistors: a bit-line-turbo series Q27, Q28, Q29; a bit-line-precharge series Q30 and Q31; an ABL-turbo series Q32, Q33, and Q34; and an ABL-precharge series Q35 and Q36. Each of these series controls a supplementary source current under respective predetermined conditions.

These four series have in common control by an enable signal ENA or its delayed inversion $\overline{ENA}$. Enable signal ENA is generated by transistors 37-40, arranged as a NOR gate. This NOR gate is the deorganized equivalent of AND gate AN2 of FIG. 3. Note that the senses of PT1 and C1 have been inverted in FIG. 4 relative to FIG. 3. No inverter is required to produce $\overline{C1}$ of FIG. 4, since the latch that holds configuration bit C1 of FIGS. 1 and 2 inherently provides complementary outputs. In FIG. 4, PMOS transistor Q41 and NMOS transistor Q42 are configured as an inverter to provided delayed and inverted enable signal $\overline{ENA}$.

The purpose of bit-line-turbo series of transistors Q27, Q28, and Q29 is to provide a strong supplementary source current to bit-line BL1 in the event that it undergoes a low-to-high transition. Such a transition cannot occur if bit line BL1 is configured to remain low (C1=0) or when BL1 and PT1 are already high. In these cases, ENA is low and transistor Q28 is off. If bit line BL1 is low but not precluded from transitioning, ENA is high and transistor Q28 is on; since, in steady state, a low BL1 implies a high NBL, transistor Q27 is on. Thus, when BL1 is low but free to transition, the bit-line turbo current is controlled by PTØ via transistor Q29.

The acceleration is quite dramatic since bit-line turbo series Q27Q29 couples bit line BL1 to VDD, e.g., 5 Volts, whereas the maximum bit-line voltage is normally much lower, e.g., about 1.2 Volts. In fact, once the desired bit-line high voltage is achieved, it is preferable to shut off the turbo current. Otherwise, the excessive voltage on bit line BL1 could delay a subsequent high-to-low bit-line transition.

To this end, NMOS transistor Q27 is controlled by NBL, which goes low during a low-to-high bit-line transition. A more moderate "precharge" current is then provided to bit line BL1 through bit-line precharge series Q30 and Q31. PMOS transistor Q30 is controlled by NBL so that it turns on when NMOS transistor Q27 turns off. The bit-line precharge continues as the change in NBL ripples through PT1, ENA, $\overline{ENA}$, and transistor Q31. Thus a strong supplementary bit-line source current begins with PT9 going high and ends with NBL going low; a weak bit-line precharge current begins with NBL going low and ends when $\overline{ENA}$ goes high. Transistors Q30 and Q31 are both on only during a low-to-high bit-line transition, so bit-line precharge series Q30 and Q31 does not require a third transistor controlled by PTØ.

Low-to-high transitions on ABL are also assisted. ABL-turbo series Q32, Q33, and Q34 turns on the same time as the bit-line-turbo series. Logic high on ABL is VDD so the ABL-turbo series need not be terminated by NBL. Instead, PMOS source transistor Q32 has its gate coupled to its drain. NMOS transistor Q33 has its gate tied to ENA, while NMOS transistor Q34 has its gate tied to PTO. Accordingly, ABLturbo series is turned on by PTØ and is turned off when a resulting transition ripples through to ENA.

ABL-precharge series Q35 and Q36 is on when ABL-turbo series turns off. Before ENA goes low during a low-to-high bit-line transition, NBL goes low, turning on PMOS transistor Q35. $\overline{ENA}$ temporarily remains low after ENA goes low due to the delay imposed by inverter Q41, Q42. Thus, PMOS transistor Q36 is on when ABL-turbo series is off. The ABL precharge continues during this inverter delay. At the end of the delay, the ABL precharge terminates.

In some cases, a low-to-high bit-line transition does not follow a 5 high-to-low word-line transition. For example, consider the case where two high word lines render respective EPROMs connected to bit line BL1 conducting. If one of these word lines goes low, one EPROM is rendered nonconducting but the other continues to conduct. In such a case, the anticipated bit-line transition does not occur. The two turbo series remain on until PTØ goes low. The two precharge series are not activated because NBL does not go low.

Transistor Q32 serves as a second current source. Its dimensions are the same as for transistor Q10 of sense amplifier SØ so that it can provide a strong source current. The dimensions of transistors Q33 and Q34 are sufficient to ensure that they do not limit this strong source current. For each of the transistors Q28 and Q29, the width is 10 microns (μm) and the length is 0.8 μm. The supplementary source current through transistors Q27-Q29 begins when PTØ goes high and ends when ENA goes low in response to PT1 going high. Transistors Q27-Q31, Q35, and Q36 have more moderate dimensions: widths of about 3 μm and lengths ranging from 1.2 μm.

It should be noted that just because a high-to-low word-line transition occurs while a bit line is low, does not means that the bit line will undergo a low-to-high transition. If another word line remains high, rendering another erased EPROM connected to the same bit line conductive, the bit line will remain low. In this case, the greater source current is provided until ENA goes low.

Every time fast mode is entered and no low-to-high bit line transition occurs, power is wasted. The present invention provides enhancements for reducing these "false positive" events. In many cases, not all word lines of a function block are required to implement a desired function. In the prior art, the EPROMs connected to such a word line are programmed so that transitions in the word line would not affect the output of the AND array. (As explained below, some of the EPROMs could remain unprogrammed.) However, such transitions would trigger the fast mode for the sense amplifiers of the present invention. Accordingly, the present invention provides for deactivation of unused word lines.

Word lines can be deactivated by setting configuration bits C IF, CIT, . . . CMF, CMT to a logic low to turn off control pass gates PG, as shown in FIG. 1. These configuration bits are latches that are set during system initialization. Their status does not change during normal operation.

The operation of a word-line configuration bit is illustrated with respect to word line WMT in FIG. 2. When CMT is set high, PG is on. PWL is decoupled from VDD, and WMT is active. When set low, configuration bit CMT not only turns off pass gate PG, but also turns on PMOS transistor Q3, holding PWL high, and thus holding WMT low. Even if the signal PM undergoes transitions, WMT remains at a constant low. Thus, no transition indications are generated in response to a changing input signal. Also note the feedback arrangement with transistor Q4 which restores PWL to a full CMOS logic high level.

The major advantage of deactivating unused word lines is that wasteful switches to fast mode are avoided. An additional advantage is that it is not necessary to program the EPROMs of an unused word line. This amounts to a time and effort saving relative to the prior art.

Just as not all word lines need be used, some designs result in unused bit lines and associated sense amplifiers in a function block. Because the outputs of sense amplifiers are inputs to OR gates, it is desirable that the outputs of unused bit lines be held low. A high input to an OR gate forces the OR-gate output high, while a low input permits the output to be controlled by other inputs.

In the prior art, an unused bit line could be implemented by ensuring that connected EPROMs controlled by complementary word lines were erased. For example, in FIG. 1, if EPROMs 1F1 and 1T1 are erased and word lines W1F and W1T are active, bit line BL1 and sense amplifier S1 output PT1 will always be low. However, this approach would result in wasteful mode switches in the context of the present invention.

Wasteful mode switches are reduced by dedicating odd row of EPROMs ØT1 to ØTN to the function of assigning unused bit lines. Erased EPROMs of this row designate unused bit lines, while EPROMs connected to active bit lines are programmed. These EPROMs are controlled by word line WØT, which is held high, as indicated by the configuration of transistor Q6 of word-line generator GØT.

Since word line WØT is held high, erased EPROMs connected to it are rendered conductive, pulling their respective bit lines low (which is the desired default for an unused bit line). Programmed EPROMs leave control of bit line level to EPROMs in other rows so that the connected bit lines remain active. Advantageously, no transition detections are triggered by transitions on word line WØT since it is held high and since no transition detector is provided for it.

During initialization, the statuses of EPROMs ØT1-ØTN are copied to configuration bits C1-CN. These configuration bits are thus low for unused bit lines and high for active bit lines. Thus, in FIGS. 3 and 4, a low configuration bit C1 inhibits ENA from going high as input to AND gate AN2 (FIG. 3) and transistor Q40 (FIG. 4). A high configuration bit C1 puts ENA in control of PTØ and PT1; likewise for the other mode-switchable sense amplifiers. Accordingly, the present invention prevents transitions to first mode based on potential transitions in unused word and bit lines.

While the preferred embodiment of the invention is described in detail above, the present invention provides for a wide range of alternatives. For example, PTØ, PT1, and C1 can be logically combined to generate an enable signal that is used to control transistors Q28 and Q33. A delayed inversion of this enable signal can be used to control transistors Q31 and Q36. By making the enable signal a function of PT as well as PT1 and C1, the need for transistors Q29 and Q34 is obviated. This not only simplifies mode control circuitry MC, but also eliminates the voltage drops associated with the omitted transistors. The tradeoff is that the response to a word-line transition is delayed due to the logical operations on PTØ.

Another alternative embodiment uses pairs of EPROMs instead of NMOS transistors for the word-line transition indicators. For active word lines, these EPROMs are erased. During a high-to-low word-line transition, both EPROMs of the respective pair conduct, forcing the transition-detection bit line high (or low, depending on the arrangement). The rest of the embodiment parallels function block FB. An advantage of using EPROMs in the global transition detector is that word-line transition detectors can be deactivated by programming the respective EPROMs (or at least one of them). This obviates the need for configuration bits C1F-CMT of FIG. 1.

While the preferred embodiment presents components with their usual senses, those skilled in the art are aware that equivalent functions can be achieved by inverting and otherwise rearranging functions and components. For example, bit lines can be coupled to the negative terminals of sense amplifiers, or a sense amplifier can provide an inverted sense output. The latches used for configuration bits have complementary terminals, so the inverse of any configuration bit is available at the opposing terminal.

While the invention has been described in relation to an AND array, it has applicability to other EPLD arrays including multiplexers, as well as EPROM memory array. Since the invention does not rely on erasing memories, it applies as well to PROM and ROM memories and PLAs and unprogrammable logic arrays. These and other modifications to and variations upon the preferred embodiments are provided for by the present invention, the scope of which is limited only by the following claims.

What is claimed is:

1. An integrated-circuit memory device comprising:

a series of word lines, each of said word lines having first and second word-line logic levels;

a series of word-line generators, each of said word-line generators converting an input logic level to one of said word-line logic levels and outputting the resulting word-line logic level to a respective one of said word lines;

a series of main bit lines, each of said bit-lines having first and second bit-line logic levels;

an array of memory elements arranged in rows and columns, each of said memory elements storing a first or a second memory value, each of said memory elements having a control input, all of said memory elements in a row having their control inputs tied to a respective one of said word lines, all of said memory elements in a column being connected to a respective one of said bit lines, each of said bit lines assuming its first bit-line logic level whenever any of the connected memory elements is storing said first memory value and has its control input at said second word-line logic level, each of said bit lines otherwise assuming its second logic level;

a global transition detector for providing a transition indication when at least one of said word lines changes from said second word-line logic level to said first word-line logic level;

at least one mode-switchable sense amplifier for providing a sense indication of a present bit-line logic level assumed by a respective one of said bit lines, said mode-switchable sense amplifier having a low-power mode and a fast mode in which transitions from said first bit-line logic level to said second bit-line logic level are indicated faster than they would be in low-power mode in the absence of a mode switch, said mode-switchable sense amplifier including mode control logic for implementing a selected one of said modes, said mode control logic selecting said fast mode only when predetermined conditions are met, said predetermined conditions including a first condition that said sense indication indicates that the respective bit line has assumed said first bit-line logic level, and a second condition that said global transition detector is providing said transition indication, said mode control logic being coupled to said global transition detector for receiving said transition indication.

2. A memory device as recited in claim 1 wherein said global transition detector includes:

a series of word-line transition detectors, each of said word-line transition detectors being coupled to a respective one of said word-line generators, each of said word-line transition detectors providing a first transition-line logic level output in the event of transition from said second word-line logic level to said first word-line logic level in a respective one of said word lines, and a second transition-line logic level output in the absence of such a transition;

a transition-detection bit line coupled to said word-line transition detectors, said transition-detection bit line assuming a first transition bit-line logic level while any of said word-line detectors is providing said first transition-line logic level output, and a second transition bit-line logic level otherwise; and a transition-detection sense amplifier coupled to said transitiondetection bit line, said transition-detection sense amplifier providing said transition indication in the form of a first indication logic level while said transition-detection bit line is assuming its first transition bit-line logic level, and a second indication logic level otherwise.

3. A memory device as recited in claim 2 wherein said transition-detection sense amplifier responds to a transition from said second bit-line logic level to said first bit-line logic level faster than said mode-switchable sense amp in its low-power mode responds to a transition in its respective bit line from said first bit-line logic level to said second bit-line logic level.

4. A memory device as recited in claim 1 wherein said mode-switchable sense amp includes weak bit-line and sense-amp current sources and strong bit-line and sense-amp current sources, said strong current sources providing source current only in said fast mode, said weak current sources providing source current in said low-power mode.

5. A memory device as recited in claim 1 further comprising deactivation means for deactivating selected ones of said word lines, word lines so deactivated assuming only said first word-line logic level.

6. A memory device as recited in claim 5 further comprising voltage means for maintaining one of said word lines at said second word-line logic level so that each of said memory elements in the respective row that is storing said first memory value maintains the bit line with which it is connected at said first bit-line logic level.

\* \* \* \* \*